(12) United States Patent
Fattal et al.

(10) Patent No.: US 7,923,802 B2
(45) Date of Patent: Apr. 12, 2011

(54) METHOD AND APPARATUS FOR FORMING A PHOTODIODE

(75) Inventors: David Fattal, Palo Alto, CA (US); Jason Blackstock, Palo Alto, CA (US); Raymond Beausoleil, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 840 days.

(21) Appl. No.: 11/580,647

(22) Filed: Oct. 13, 2006

(65) Prior Publication Data

US 2008/0090318 A1    Apr. 17, 2008

(51) Int. Cl.
*H01L 31/0224* (2006.01)

(52) U.S. Cl. ............... 257/448; 257/E31.124; 257/431; 438/98; 136/256

(58) Field of Classification Search .............. 257/290, 257/291, 292, 431, 435, 436, 443, 448, E27.133, 257/E31.124; 438/98; 136/256
See application file for complete search history.

(56) References Cited

U.S. PATENT DOCUMENTS

| | | | | |
|---|---|---|---|---|
| 3,475,609 A | * | 10/1969 | Schneider | 359/245 |
| 3,622,844 A | * | 11/1971 | Barelli et al. | 257/438 |
| 4,011,016 A | * | 3/1977 | Layne et al. | 356/402 |
| 4,727,254 A | * | 2/1988 | Wlodarczyk | 250/227.18 |
| 4,975,919 A | * | 12/1990 | Amada et al. | 372/33 |
| 5,985,689 A | * | 11/1999 | Gofuku et al. | 438/59 |
| 6,040,936 A | * | 3/2000 | Kim et al. | 359/245 |
| 6,992,774 B2 | * | 1/2006 | Creasey et al. | 356/450 |
| 7,223,960 B2 | * | 5/2007 | Mouli | 250/226 |
| 7,245,808 B2 | * | 7/2007 | Sato et al. | 385/129 |
| 7,417,219 B2 | * | 8/2008 | Catrysse et al. | 250/234 |
| 7,544,922 B2 | * | 6/2009 | Ueyanagi et al. | 250/216 |
| 2006/0192115 A1 | * | 8/2006 | Thomas et al. | 250/306 |
| 2006/0291780 A1 | * | 12/2006 | Sato et al. | 385/39 |
| 2007/0096087 A1 | * | 5/2007 | Catrysse et al. | 257/40 |
| 2008/0090318 A1 | * | 4/2008 | Fattal et al. | 438/48 |
| 2008/0212102 A1 | * | 9/2008 | Nuzzo et al. | 356/445 |
| 2008/0266640 A1 | * | 10/2008 | Wang et al. | 359/244 |
| 2008/0278728 A1 | * | 11/2008 | Tetz et al. | 356/445 |
| 2008/0290434 A1 | * | 11/2008 | Chen et al. | 257/431 |

OTHER PUBLICATIONS

M. Rahman, et al. "Theory of a Metal-Semiconductor Photodiode With Granting Coupling of the Incident Light to Surface Plasma Waves" J. Appl. Phys. 66 (1), Jul. 1, 1989.

* cited by examiner

*Primary Examiner* — Mary Wilczewski

(57) ABSTRACT

Embodiments of the invention provide a method and an apparatus for forming a photodiode. One embodiment provides a thin dielectric layer sandwiched between two metallic plates (electrodes), one or both of which are periodically patterned in one or two dimensions. The effect of the pattern is to couple incident light within some range of wavelength and/or incidence angles to surface excitations of the metal surface called surface plasmons, enhancing the electric field near the surface and resulting in dramatically increased photo-absorption and carrier generation in the dielectric layer.

7 Claims, 6 Drawing Sheets

350

400

```
┌─────────────────────────────────────────────────────┐
│ PROVIDES A REGION OF SEMICONDUCTOR MATERIAL HAVING A FIRST │
│         SURFACE AND A SECOND SURFACE.               │
│                     402                             │
└─────────────────────────────────────────────────────┘
                         │
                         ▼
┌─────────────────────────────────────────────────────┐
│  COUPLES A FIRST CONDUCTIVE LAYER TO SAID FIRST SURFACE OF │
│           SAID SEMICONDUCTOR MATERIAL.              │
│                     404                             │
└─────────────────────────────────────────────────────┘
                         │
                         ▼
┌─────────────────────────────────────────────────────┐
│     COUPLES A SECOND CONDUCTIVE SURFACE TO SAID SECOND     │
│      SURFACE OF SAID SEMICONDUCTOR MATERIAL TO FORM A      │
│     PHOTODIODE, SAID SECOND CONDUCTIVE SURFACE COMPRISING A│
│       METAL SURFACE HAVING A TWO-DIMENSIONAL PERIODIC ARRAY OF│
│       OPENINGS THERETHROUGH, WHEREIN SAID PHOTODIODE IS    │
│  CONFIGURED TO BE OPERATED SUCH THAT LIGHT IS INCIDENT ON SAID│
│              SECOND CONDUCTIVE SURFACE.             │
│                     406                             │
└─────────────────────────────────────────────────────┘
```

FIG. 4 under control of cursor direction keys for communicating direction information and command selections to the processor.

METHOD AND APPARATUS FOR FORMING A PHOTODIODE

TECHNICAL FIELD

The present invention generally relates to a method and apparatus for forming a photodiode.

BACKGROUND ART

Generally, photodiodes are semiconductor diodes that are used to convert photons into an electrical current. For example, a photodiode may be used to convert an optical signal into an electronic signal in an opto-electronic circuit, or placed at any location in which incident light detection is desired.

Presently, one type of manufactured photodiode—so called MSM for metal-semiconductor-metal—includes a portion of quality semiconductor material sandwiched in between two metallic plates and a voltage is applied to the plates. When incident light in a broad range of wavelength reaches the semiconductor material, a plurality of electron-hole pairs are created. The electrons will travel in one direction, e.g., toward the positive plate, and the holes will travel in the opposite direction. The incident light is then detected by monitoring the current running though the photodiode circuit.

However, there are pluralities of problems with the present state of photodiodes. One of the problems is the expense of manufacturing the photodiode. That is, in order to provide the best level of detection, present photodiodes require extremely high quality semiconductor material such as single crystal silicon. For example, in order to detect the most minimal of electron-hole pairs, the semiconductor material crystal structure must be as flawless as possible to ensure a minimum of interruptions in the travel of the electro-hole pairs. Thus, the present manufacturing method realizes a great expense in both material and quality control.

Another problem with the present state of photodiodes is the amount of semiconductor material needed to form the photodiodes. For example, when detecting light, the best of the photodiodes utilizes semiconductor material between the metal plates having a width of approximately the wavelength of the light being detected. Therefore, not only is the semiconductor material very expensive in material and quality control, but a large quantity of the high quality semiconductor material is required for the photodiode.

Yet another problem with the present state of photodiodes is the speed of the diode. For example, the electric field of a photodiode is defined by the voltage applied divided by the distance between the electrodes. As such, turning on, e.g., windowing, the photodiode can take an amount of time due to the need to ramp up the voltage to the required level to make the photodiode operational. This ramp up time takes time which results in a delay between the turning on of the photodiode and the actual operation of the photodiode. Moreover, because of the width of the semiconductor material, the drift, e.g., the time it takes an electron-hole pair to cover the width of the silicon and reach the plates, also provides a delay in the overall photodiode detection speed. If the speed wants to be increased, one needs to apply more voltage to The photodiode, producing more dark current.

DISCLOSURE OF THE INVENTION

Embodiments of the invention provide a method and an apparatus for forming a photodiode. One embodiment provides a thin dielectric layer sandwiched between two metallic plates (electrodes), one or both of which are periodically patterned in one or two dimensions. The effect of the pattern is to couple incident light within some range of wavelength and/or incidence angles to surface excitations of the metal surface called surface plasmons, enhancing the field near the surface and resulting in dramatically increased photo-aborption and carrier generation in the dielectric layer.

BRIEF DESCRIPTION OF THE DRAWINGS

The accompanying drawings, which are incorporated in and form a part of this application, illustrate embodiments of the present invention, and together with the description, serve to explain the principles of the invention. Unless noted, the drawings referred to this description should be understood as not being drawn to scale.

FIG. 4 is a flowchart of an exemplary method for forming a photodiode in accordance with one embodiment of the present invention.

BEST MODE FOR CARRYING OUT THE INVENTION

Figure 1:
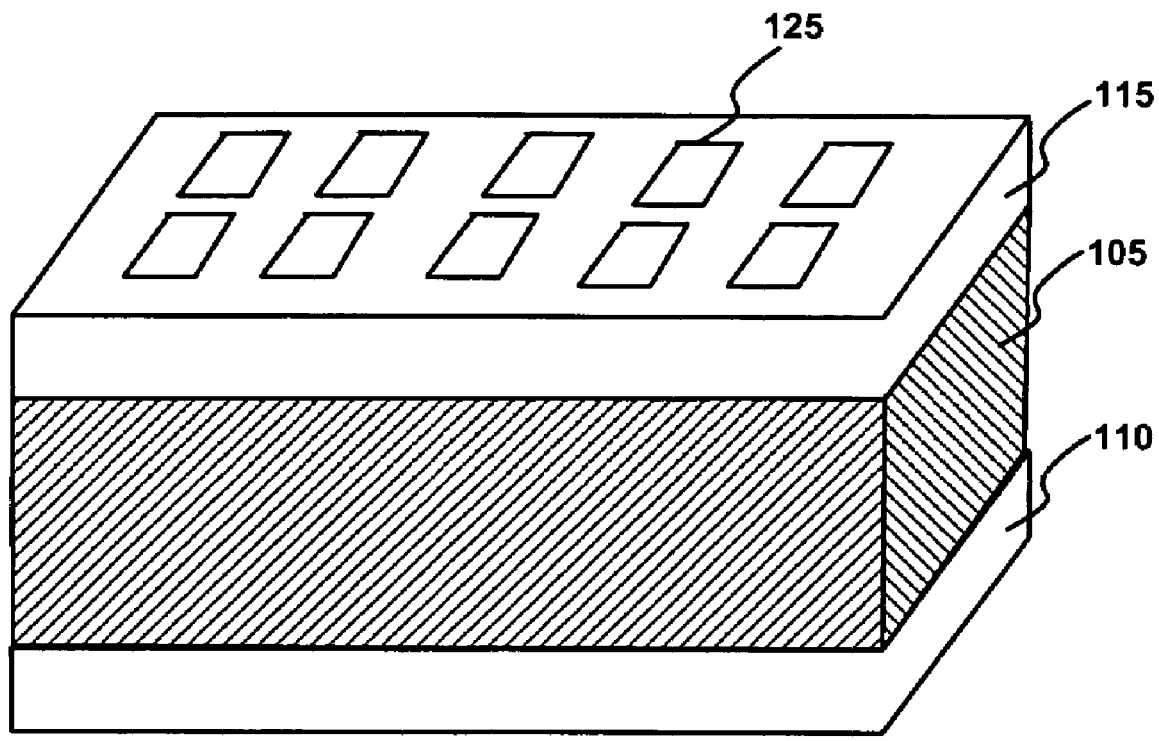
FIG. 1 is a perspective view of an exemplary photodiode in accordance with one embodiment of the present invention.

Reference will now be made in detail to various embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following description of the present invention, numerous specific details are set forth in order to provide a thorough understanding of the present invention. In other instances, well-known methods, procedures, objects, and circuits have not been described in detail as not to unnecessarily obscure aspects of the present invention.

Aspects of the present invention may be practiced on a computer system that includes, in general, a processor for processing information and instructions, random access (volatile) memory (RAM) for storing information and instructions, read-only (non-volatile) memory (ROM) for storing static information and instructions, a data storage device such as a magnetic or optical disk and disk drive for storing information and instructions, an optional user output device such as a display device (e.g., a monitor) for displaying information to the computer user, an optional user input device including alphanumeric and function keys (e.g., a keyboard) for communicating information and command selections to the processor, and an optional user input device such as a cursor control device (e.g., a mouse) for communicating user input information and command selections to the processor.

Overview

Embodiments of the technology described herein provide a method and apparatus for forming a photodiode. Moreover, embodiments described herein provide a surface plasmon enhanced photodiode. For example, in one embodiment, the photodiode of the present invention includes an amount of semiconductor material between two conductive plates. When an amount of incident light of a certain wavelength is shined on the semiconductor material, electron-hole pairs are created. By applying voltage to the conductive plates the electrons will travel to one plate while the holes will "travel" to the other plate. By utilizing a voltage or electrical current detector, the photo-generation of electron-hole pairs caused by the incident light, can be observed. This observation results in a "detection" of the incident light of a certain wavelength.

However, the present technology utilizes a significantly different approach to the photodiode operation. That is, in one embodiment, one or both conductive plates are patterned with a periodic array of openings. If one plate only is patterned, the conductive plate with the periodic array of openings is now the surface directed toward the incident light. Moreover, the openings and periodicity of the periodic array in the conductive plate is also adjustable to provide detection of different wavelengths of light, with an adjustable tolerance for incidence angles.

By forming the openings in the conductive plate and directing the conductive plate toward the incident light, the incident light may be able to excite surface plasmons present on the conductive plate. In so doing, the incident light may be converted into horizontal excitation which enhances the electric field at the patterned surface of the photodiode and into the first portion of the semiconductor material layer by a significant factor.

The enhancement of the electric field significantly increases the absorption characteristic of the first few nanometers (nm), e.g., 0-25 nm, of the semiconductor material. As such, a photodiode using the present technology may utilize a semiconductor material layer of approximately 25 nm or less while the best prior photodiodes require a semiconductor material layer of thickness on the order of a micron.

By significantly increasing the absorption characteristic of the semiconductor material, the amount of semiconductor material required for photodiode manufacture is also significantly decreased. Moreover, this decrease in semiconductor material results in a photodiode having a reduced manufacturing cost while providing the same or even an increased level of performance.

Furthermore, because the distance between the conductive plates is reduced, due to the reduction in semiconductor material thickness, the same (or better) performance of the photodiode is also realized at a significantly lower applied voltage.

Moreover, because the electron-hole pair travel distance is significantly reduced, the same (or better) performance of the photodiode is also realized with standard semiconductor materials instead of relying on single crystal silicon or other costly semiconductor materials. Moreover the diode can then be operated faster—e.g. for time-gating or "windowing" (photogenerated carriers reach their electrode much faster now). Moreover the efficiency of the diode is increased since electron and holes have now lower probability of recombining radiatively before they are collected at their respective electrodes.

In addition, because, in one embodiment, the operating voltage is significantly reduced, the dark current of the diode will be reduced accordingly.

In one embodiment, the wavelength selectivity of the patterned metal surface ensures that only light in a specified range of wavelength and/or angle gets absorbed. For instance if we want to detect light of wavelength 800 nm, the signal will not be polluted by spurious light at wavelength 850 nm. In other words, the present technology may also utilize the second conductive surface having a two-dimensional periodic array of openings therethrough for detecting a light signal at a certain wavelength or angle of incidence in a background containing at least one other light signal having another wavelength or angle of incidence.

That is, by utilizing a two-dimensional periodic array of openings, e.g., a two-dimensional grating, the present technology is capable of coupling both the polarization of the light as well as any or all incidence angles of the light being received with the surface plasmons present on the conductive plate.

Structure

With reference now to FIG. 1, a perspective view of an exemplary photodiode 100 is shown in accordance with one embodiment of the present invention. In general, photodiode 100 includes a region of semiconductor material 105, a first conductive layer 110 and a second conductive layer 115. Second conductive layer 115 includes a two-dimensional periodic array of openings 125.

In general, the semiconductor material 105 may be formed of semiconductor material such as single crystal silicon, amorphous silicon, organic matter or the like. In one embodiment, the first conductive layer 110 may be formed from a metal, heavily doped semiconductor material or the like. Moreover, the second conductive layer 115 may be formed from metal.

Figure 2:
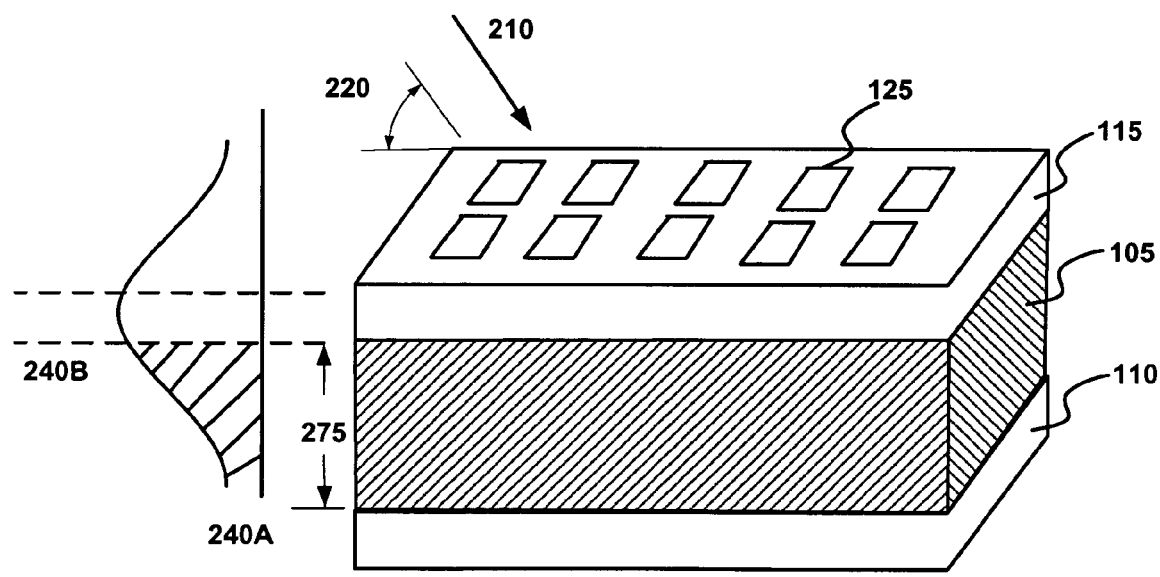
FIG. 2 is a perspective view of incident light and a resulting increased absorption field for an exemplary photodiode in accordance with one embodiment of the present invention.

Referring now to FIG. 2, a perspective view of incident light 210 and a resulting increased absorption field (240A and 240B) for an exemplary photodiode 200 is shown in accordance with one embodiment of the present invention. In general, photodiode 200 includes a region of semiconductor material 105, a first conductive layer 110 and a second conductive layer 115 similar to that described in reference to FIG. 1.

In addition, FIG. 2 includes incident light 210 which is received at the second conductive layer 115 at an angle of incidence 220. In general, incident light 210 may be laser light, or other light at a wavelength that may be detected by photodiode 200.

The thickness 275 of the semiconductor material layer 105 is also shown in accordance with the increased absorption field characteristic. Specifically, the regular absorption characteristic of the semiconductor material is shown as 240A while the surface plasmon enhanced absorption characteristic of the semiconductor material is shown (not to scale) as 240B. However, the absorption characteristics of 240B are exemplary and are provided herein merely for purposes of brevity and clarity. That is, the absorption characteristics are provided to illustrate an exemplary gain in the semiconductor incident light absorption capabilities and may be modifiable based on the opening 125 sizes and configuration.

In one embodiment, the angle of incidence 220 of the incident light 210 may be adjusted by adjusting the source of incident light 210, by rotating or moving the direction photodiode 200 faces or by a combination thereof. For example, the angle of incidence 220 of the incident light 210 may be changed to allow the photodiode to detect different wavelengths of light. In another embodiment, the angle of incidence 220 may not change, but the shape, period, or other aspects of the openings 125 may be modified to detect different wavelengths of light 210. In yet another embodiment, both the angle of incidence and the openings 125 may be modified. Moreover, the first conductive layer 110 may have a different pattern of periodically arrayed openings 125. As such, the surface (e.g., first conductive layer 110 or second conductive layer 115) of the photodiode used to detect the incident light 210 may be switched depending on the wavelength of the light to be detected.

Figure 3A:
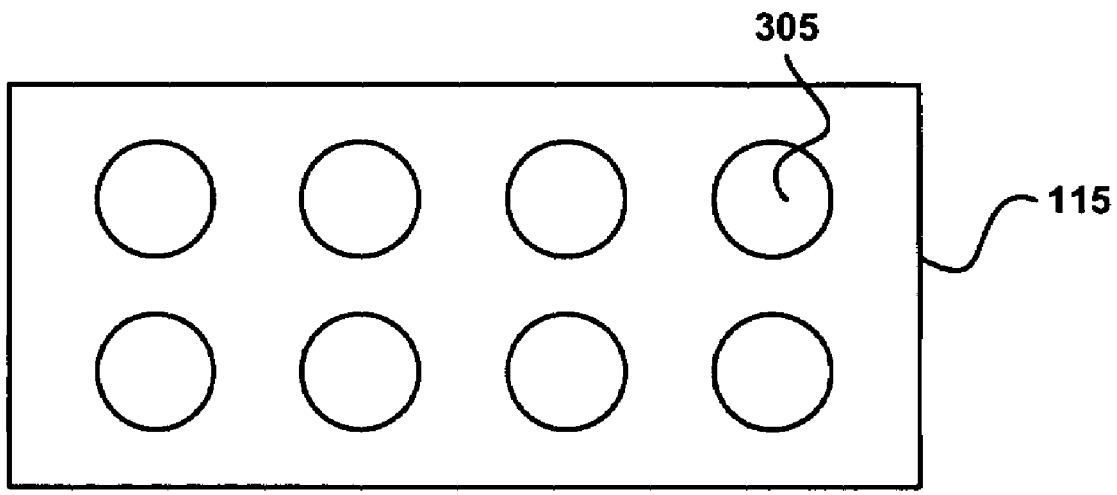
FIG. 3A is a top view of an exemplary conductive surface having a two-dimensional periodic array of openings in accordance with one embodiment of the present invention.

With reference now to FIG. 3A, a top view 300 of an exemplary conductive surface 115 having a two-dimensional periodic array of openings 305 is shown in accordance with one embodiment of the present invention.

The openings 305 are provided herein as one of the plurality of possible geometrically configured openings that may be used. That is, although the openings are shown as circles in a plurality of rows, they are merely one of the pluralities of possible periodic arrays which may be utilized in conjunction with the present technology. Moreover, although the openings are shown in second conductive layer 115, embodiments described herein are well suited to the openings being in first conductive layer 110 or both first conductive layer 110 and second conductive layer 115. Furthermore, the periodically arrayed openings 305 that are in both first conductive layer 110 and second conductive layer 115 may have different shapes.

Figure 3B:
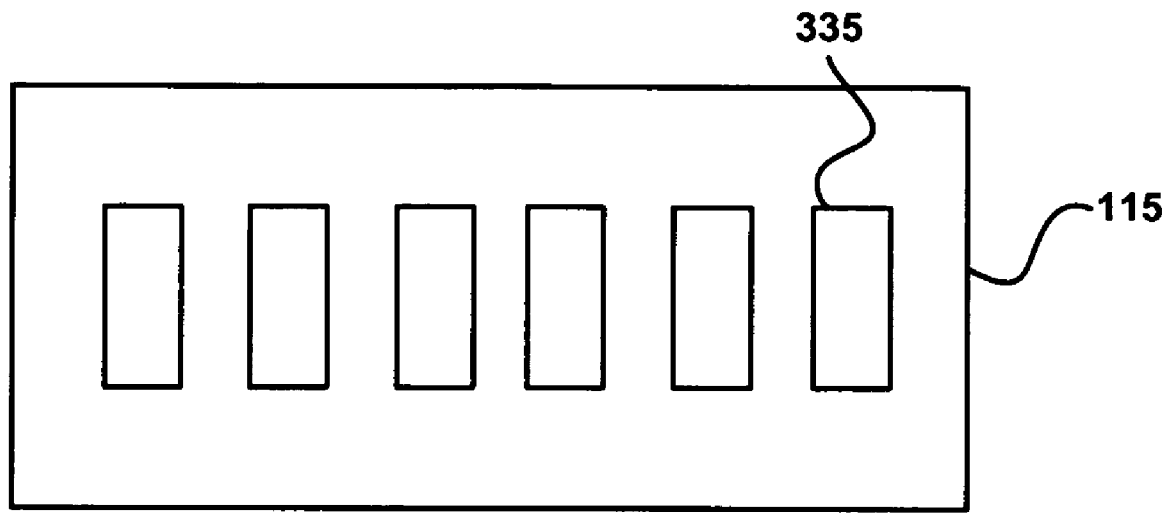
FIG. 3B is a top view of an exemplary conductive surface having a two-dimensional periodic array of openings in accordance with another embodiment of the present invention.

Referring now to FIG. 3B, a top view 325 of an exemplary conductive surface 115 having a two-dimensional periodic array of openings 335 is shown in accordance with another embodiment of the present invention.

The openings 335 are provided herein as one of the plurality of possible geometrically configured openings that may be used. That is, although the openings are shown as rectangles and are shown in a single row, they are merely one of the pluralities of possible periodic arrays which may be utilized in conjunction with the present technology. Moreover, as previously stated, although the openings are shown in second conductive layer 115, embodiments described herein are well suited to the openings being in first conductive layer 110 or both first conductive layer 110 and second conductive layer 115. Furthermore, if the periodically arrayed openings 335 are in both first conductive layer 110 and second conductive layer 115 they may have different shapes or configurations depending on the wavelengths of light to be detected.

Figure 3C:
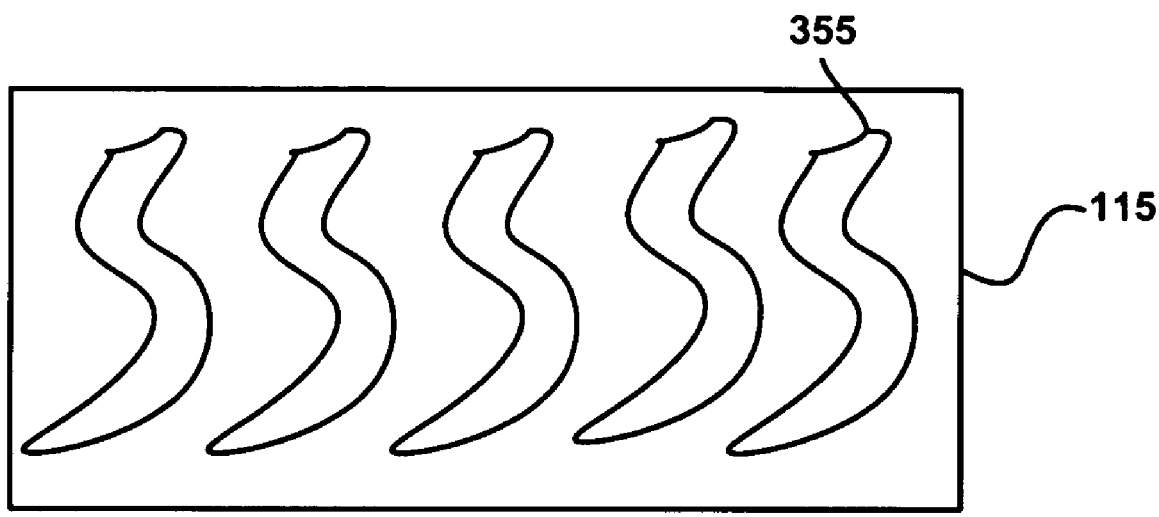
FIG. 3C is a top view of an exemplary conductive surface having a two-dimensional periodic array of openings in accordance with yet another embodiment of the present invention.

With reference now to FIG. 3C, a top view 350 of an exemplary conductive surface 115 having a two-dimensional periodic array of openings 355 is shown in accordance with yet another embodiment of the present invention.

The openings 355 are provided herein as one of the plurality of possible geometrically configured openings that may be used. That is, although the openings are shown as non-geometric shapes and are shown in a single row, they are merely one of the plurality of possible periodic arrays which may be utilized in conjunction with the present technology. That is, the present technology is well suited to openings in the conductive layer that are other than geometrically shaped.

Moreover, as previously stated, although the openings are shown in second conductive layer 115, embodiments described herein are well suited to the openings being in first conductive layer 110 or both first conductive layer 110 and second conductive layer 115. Furthermore, the periodically arrayed openings 355 that are in both first conductive layer 110 and second conductive layer 115 may have different shapes.

Operation

Referring now to FIG. 4, a flowchart of an exemplary method for forming a photodiode is shown in accordance with one embodiment of the present invention.

With reference now to 402 of FIG. 4 and to FIG. 2, one embodiment provides a region of semiconductor material 105 having a first surface and a second surface. As stated herein, the semiconductor material 105 may be formed of semiconductor material such as single crystal silicon, amorphous silicon, organic matter or the like.

Referring now to 404 of FIG. 4 and to FIG. 2, one embodiment couples a first conductive layer 110 to the first surface of the semiconductor material 105. In one embodiment, the first conductive layer 110 may be formed from a metal, heavily doped semiconductor material or the like.

With reference now to 406 of FIG. 4 and to FIG. 2, one embodiment couples a second conductive surface 115 to the second surface of the semiconductor material 105 to form a photodiode 200. In one embodiment, the second conductive surface 115 includes a metal surface having a two-dimensional periodic array of openings 125 therethrough.

In one embodiment, the photodiode 200 is configured to be operated such that light 210 is incident on the second conductive surface 115 instead of requiring the light 210 to be incident on the semiconductor material 105.

That is, the photodiode 200 is configured to operate with the incident light 210 striking a conductive plate 115, having openings 125 therethrough. This change in operation is due to a surface excitation of the metal that can be modified based on the shape and periodicity of the openings. In one embodiment, the shape and periodicity of the openings in the conductive layer 115 are referred to as grating.

For example, the grating allows incident light 210 to communicate with surface plasmons. Thus, for a particular range of wavelengths (controlled by changing the spacing, periodicity and/or shape of the openings in the grating) incident light 210 can be converted into horizontal excitation. That is, there is a mode overlap between the surface plasmons and the incident light which provides an increase in the energy level from the surface to approximately 15 nm in depth for photodiode 200.

In general, mode overlap refers to the plasmon modes and the incident light modes. For example, on a flat surface, the plasmon modes exist but have no overlap with free space. That is, the vectors are orthogonal. However, by adding a grating to the surface, e.g., conductive layer 115, a non-orthogonal component is added to the plasmon modes on the surface. This non-orthogonal component allows free space modes, e.g., modes from the incident light 210, to couple therewith. The resulting mode overlap provides the increased horizontal excitation.

During the conversion into horizontal excitation, energy is accumulated on the surface of the conductive layer 115. Moreover, a field (e.g., as shown in 240A and 240B) is built up based on the supplied incident light 210. This buildup in field energy is referred to as an evanescent field and, in one embodiment, extends approximately 10 nm-20 nm below the surface of the photodiode 200. By modifying the size, shape, and periodicity of the grating, the wavelength range of light that interacts with the surface plasmons may be adjusted thereby resulting in a photodiode 200 that can be designed for detection of a particular wavelength or range of wavelengths.

Because of the build up of the evanescent field, the intensity of the field 240B close to the conductive plate 115 will create electron-hole pairs at a rate increased by a factor of approximately 1 or 2 orders of magnitude. In so doing, the new photodiode 200 will require approximately 10 nm or a few 10 nm's of semiconductor material 105 to absorb the same amount of light as previous photodiode operation.

In other words, since in one embodiment, the incident light 210 is now received at the second conductive layer 115 having the periodically arrayed openings 125 therethrough, and the interaction with the surface plasmons on the second conductive layer 115 significantly increases the absorption characteristics of the semiconductor material 105, the thickness of the semiconductor material 105 is significantly reduced.

For example, in prior photodiode operation, the semiconductor material thickness was approximately one micron. Additionally, because the semiconductor material was that thick, the conductive plates on each side of the semiconductor material required a high voltage to ensure that electron-hole pairs, generated when incident light struck the semiconductor material, would travel the entire distance to reach the conductive plates.

However, in the present technology, the semiconductor material 105 thickness 275 is reduced by one or two orders of magnitude. That is, the semiconductor material may be reduced to a thickness of 25 nm, 10 nm or even thinner. In so doing, any electron-hole pairs generated when the incident light reaches the semiconductor material travel a significantly reduced distance. Because the travel distance is reduced, the drift time of the electron-hole pairs is also reduced.

Moreover, the quality requirements of the semiconductor material 105 are significantly reduced. For example, since the electron-hole pairs are traveling 20 times less distance, flaws in the semiconductor material will have significantly less opportunity to affect the electron-hole pairs from reaching the conductive plates. Moreover, because much less semiconductor material 105 is being used, the number of flaws in the semiconductor material is also reduced as a matter of ratio.

Furthermore, the present technology photodiode 200 operating at the same level of detection as the previously described photodiode has an operational voltage that is reduced by a factor of 20 or more. In other words, because the size of the electric field is equal to the voltage applied divided by the distance between electrodes, when the distance between electrodes is reduced by a factor of 20, then the voltage applied may also be reduced by a factor of 20 while maintaining the same electric field.

Therefore, by reducing the voltage applied to the photodiode 200 the dark current of the photodiode 200 can be significantly reduced. Additionally, the photodiode 200 can now be time-gated or "windowed" in a fast way, reducing the build-up of dark current and providing increased temporal resolution or bandwidth.

However, in another embodiment, instead of reducing the operating voltage by the same factor as the reduction in electrode distance, the operating voltage may be reduced by a different factor (e.g., ½, ⅓, ⅛, etc.). Thus, if the operating voltage was reduced by half, the new photodiode 200 would have an electric field that was twice the strength of the previous field while using an operational voltage that is reduced by a factor of 10. In other words, although the photodiode 200 may retain the operating standards of the previous technology while utilizing a significant applied voltage reduction, the photodiode 200 may also significantly increase the operating range and capabilities of the previous photodiode technology by maintaining the original applied voltage, or partially reducing the voltage, based on the operational characteristics requirements of the photodiode 200. Moreover, the present photodiode 200 technology is well suited to adjusting any number of variables described herein to provide a photodiode 200 that operates at a significantly reduced expense, while still providing significantly increased detection characteristics.

In another embodiment, the first conductive surface 110 is formed from a metal and also includes a two-dimensional periodic array of openings 125. In other words, both sides of the photodiode 200 may include a two-dimensional periodic array of openings 125. For example, the first conductive surface 110 may have a plurality of periodic openings directed toward a first range of wavelengths to be detected and the second conductive surface 115 may have a plurality of periodic openings directed toward a second range of wavelengths to be detected. In so doing, the wavelength of light to be detected by the photodiode 200 may be adjusted by switching the conductive surface of the photodiode 200 facing the incident light 210.

Moreover, depending on the wavelength of light to be detected by the photodiode 200, the orientation of the photodiode 200 may be changed to modify wavelength selectivity. That is, during the operational phase of the photodiode 200, the angle 220 between the conductive surface having the periodically arrayed openings thereon and the incident light 210 may be adjusted for a specific wavelength or range of wavelengths being detected.

Furthermore, depending on the wavelength of light to be detected by the photodiode 200, the periodicity of the plurality of openings may be configured to modify wavelength selectivity. That is, during the design phase of the photodiode 200, the periodically arrayed openings may be shaped and spaced based on the best layout for a specific wavelength or range of wavelengths to be detected.

Thus, embodiments of the present invention provide a method and apparatus for forming a photodiode with a significantly reduced z-direction. Embodiments further provide a method and apparatus for forming a photodiode which increase the response time of the photodiode without sacrificing efficiency. Furthermore, embodiments provide applications in the telecom and global interconnects arena as well as between electronic chips. Moreover, because of the significant size and operational reductions, the high speed and capability to build the photodiode "on-chip" may allow the photo detectors to also act as demodulators.

Embodiments of the present invention are thus described. While the present invention has been described in particular embodiments, it should be appreciated that the present invention should not be construed as limited by such embodiments, but rather construed according to the following claims.

We claim:

1. A photodiode comprising:
    a region of semiconductor material having a first surface and a second surface;
    a first conductive layer coupled with said first surface of said semiconductor material;
    a second conductive layer coupled with said second surface of said semiconductor material, said second conductive layer comprising a metal layer having a two-dimensional periodic array of openings therethrough, said periodic array of openings configured to couple incident light with surface plasmons of said second conductive layer, for enhancing an electric field near said second surface by converting said incident light into horizontal excitation within said semiconductor material;
    wherein said photodiode provides detecting of said incident light directed toward said second conductive layer having said two-dimensional periodic array of openings therethrough.

2. The photodiode of claim 1 wherein said first conductive layer is a heavily doped semiconductor layer.

3. The photodiode of claim 1 wherein said first conductive layer is a metal layer.

4. The photodiode of claim 1 wherein said second conductive layer is a heavily doped semiconductor layer having a two-dimensional periodic array of openings therethrough.

5. The photodiode of claim 1 wherein said second conductive layer is a metal layer having a two-dimensional periodic array of openings therethrough.

6. The photodiode of claim 1 further comprising:
a wavelength detector selectivity module, wherein said wavelength detector selectivity module modifies a wavelength being detected by the photodiode by modifying portions of said second conductive layer selected from the group consisting of: adjusting a periodicity of said plurality of openings of said second conductive layer and adjusting a shape of said plurality of openings of said second conductive layer.

7. The photodiode of claim 1 further comprising:
a wavelength detector selectivity module, wherein said wavelength detector selectivity module modifies a wavelength being detected by said photodiode by adjusting the orientation of said photodiode.

* * * * *

UNITED STATES PATENT AND TRADEMARK OFFICE
CERTIFICATE OF CORRECTION

| | | |
|---|---|---|
| PATENT NO. | : 7,923,802 B2 | Page 1 of 1 |
| APPLICATION NO. | : 11/580647 | |
| DATED | : April 12, 2011 | |
| INVENTOR(S) | : David Fattal et al. | |

It is certified that error appears in the above-identified patent and that said Letters Patent is hereby corrected as shown below:

In column 2, line 5, delete "the field" and insert -- the electric field --, therefor.

Signed and Sealed this
Twenty-ninth Day of November, 2011

David J. Kappos
*Director of the United States Patent and Trademark Office*